United States Patent [19]

Wu

[11] Patent Number: 5,877,048

[45] Date of Patent: Mar. 2, 1999

[54] 3-D CMOS TRANSISTORS WITH HIGH ESD RELIABILITY

[75] Inventor: Shye-Lin Wu, Hsinchu, Taiwan

[73] Assignee: Texas Instruments—Acer Incorporated, Hsinchu, Taiwan

[21] Appl. No.: 46,331

[22] Filed: Mar. 23, 1998

[51] Int. Cl.⁶ .................. H01L 21/8238; H01L 21/76
[52] U.S. Cl. .................. 438/199; 438/218; 438/412; 438/423
[58] Field of Search .................. 438/370, 423, 438/440, 526, 410, 404, 405, 443, 412, 425, 407, 473, 162, 154, 218, 155, 161, 164; 257/458

[56] References Cited

U.S. PATENT DOCUMENTS

| | | | |
|---|---|---|---|
| 5,113,236 | 5/1992 | Arnold et al. | 357/41 |
| 5,338,965 | 8/1994 | Malhi | 257/492 |
| 5,422,296 | 6/1995 | Lage | 437/52 |
| 5,795,800 | 8/1998 | Chan et al. | 438/149 |
| 5,795,809 | 8/1998 | Gardner et al. | 438/402 |

OTHER PUBLICATIONS

S. Maeda et al., *Suppression of Delay Time Instability on Frequency using Field Shield Isolation Technology for Deep Sub–Micron SOI Circuits,* 1996 IEEE, pp. 129–132.

J.A. Babcock et al., *Low–Frequency Noise Dependence of TFSOI BiCMOS for Low Power RF Mixed–Mode Applications,* 1996 IEEE, pp. 133–136.

Mansun Chan et al., *ESD Reliability and Protection Schemes in SOI CMOS Output Buffers,* IEEE Transductions on Electron Devices, vol. 42, No. 10, Oct. 1995, pp. 1816–1821.

*Primary Examiner*—Jey Tsai
*Assistant Examiner*—Christopher Lattin
*Attorney, Agent, or Firm*—Harness, Dickey & Pierce, P.L.C.

[57] ABSTRACT

The present invention discloses a method for manufacturing 3-D transistors with high electrostatic discharge (ESD) reliability. Pad oxide layers are on a silicon substrate and a thick field oxide is on the silicon substrate between the pad oxide layer. An oxygen amorphized region is formed in the substrate by using an ion implantation having oxygen ions as dopants and the field oxide as a hard mask. A high-temperature thermal annealing is implemented to convert the oxygen amorphized region into an oxygen implant-induced oxide regions. Then, the pad oxide layers and the field oxide are removed to form a field oxide region on the substrate and silicon islands on the oxygen implant-induced oxide regions. A thin gate oxide is deposited on the surface of the substrate and the silicon islands to seal the silicon islands. Finally, PMOSFETs are formed on the silicon islands and bulk NMOSFET buffers are formed on the field oxide region of the substrate.

16 Claims, 3 Drawing Sheets

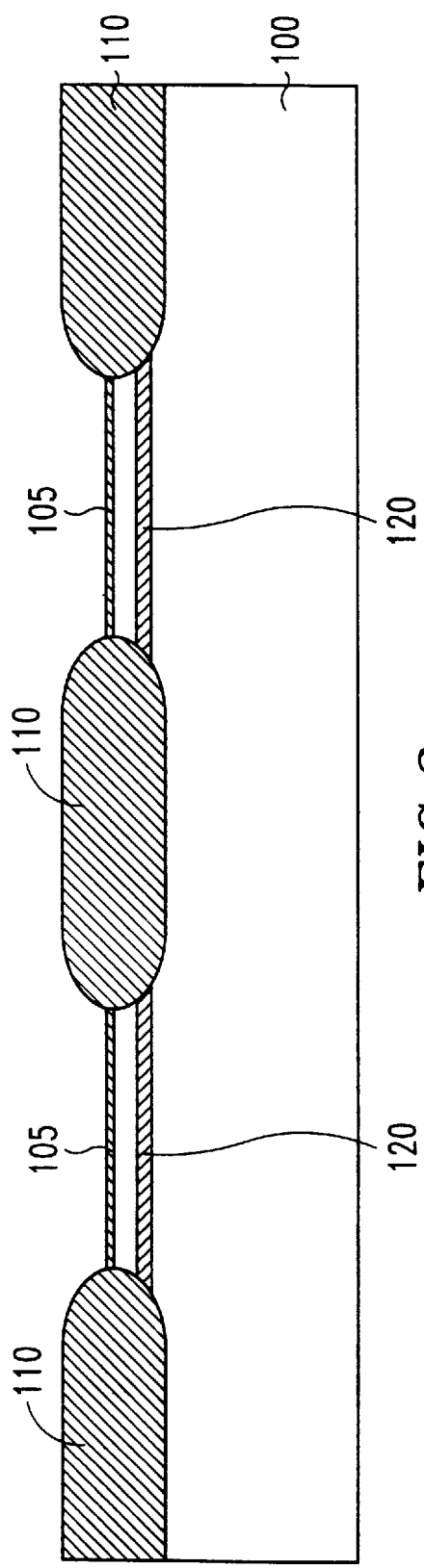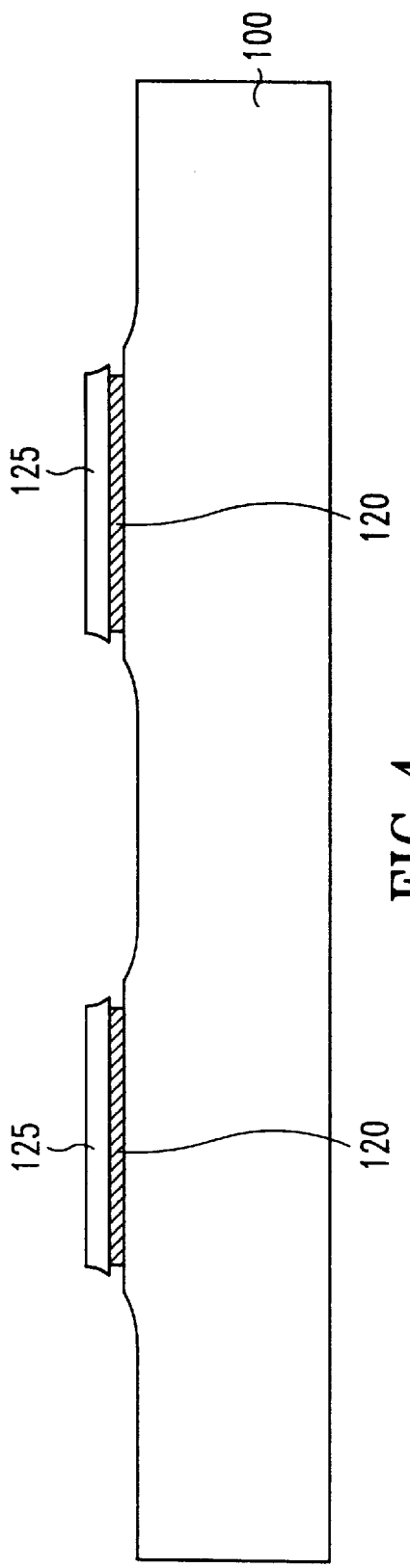

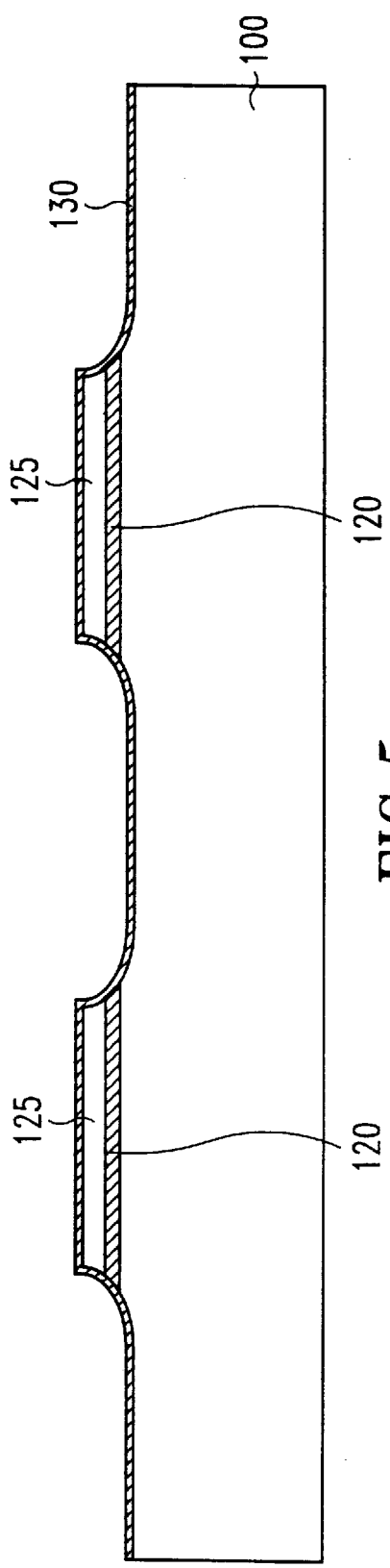
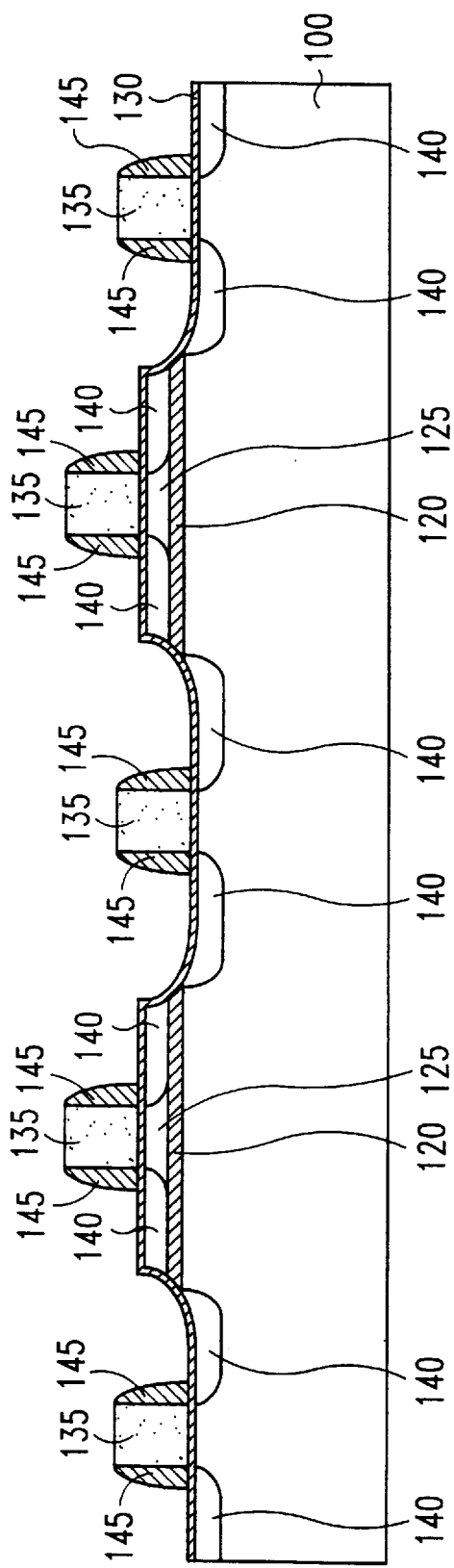

5,877,048

3-D CMOS TRANSISTORS WITH HIGH ESD RELIABILITY

FIELD OF THE INVENTION

The present invention relates to a method of manufacturing deep sub-micron SOI CMOS, and more specifically, to a method of simultaneously manufacturing SOI PMOS devices in the silicon islands and bulk NMOS buffers in the substrate.

BACKGROUND OF THE INVENTION

In recent years devices have been fabricated in a thin silicon layer on a silicon substrate. The technique for building the silicon layer on the insulating substrate is referred to as the silicon on insulator (SOI) technique. A complementary metal oxide semiconductor (CMOS) device in the silicon on insulator has good device characteristics, for example, high speed and low power. In IEDM Tech. Dig., on page 129 on 1996, S. Maeda et al. reported that a deep sub-micron SOI circuit is manufactured by using field shield isolation technology. The paper is entitled "Suppression of Delay Time Instability on Frequency using Field Shield Isolation Technology for Deep Sub-Micron SOI Circuits". The authors were successful in suppressing delay time instability depending on frequency using field shielding isolation technology for deep sub-micron SOI circuits and preventing the instability over wide input frequency range. The method of the paper offered a stable circuit operation compatible with bulk circuits by using field shielding isolation technology while keeping SOI benefits. In this paper, separation by implanted oxygen (SIMOX) was used to form a thin silicon layer on an insulator (SOI) and a MOS device was constructed on the SOI without any area penalties in gate array. The gate layer of the MOS device has a thickness about 70 angstroms, a SOI layer of the device has a thickness about 1000 angstroms and a buried oxide layer has a thickness about 4000 angstroms in this paper.

The SOI CMOS transistors have a better latch-up immunity, a better short channel behavior, a process-simplification advantage and a higher device speed than the bulk CMOS transistors. The SOI CMOS transistors are usually fabricated for radio-frequency application. Babcock demonstrated a TFSOI BiCMOS device in IEDM Tech. Dig., page 133, 1996. The title of the paper is "Low-Frequency Noise Dependence of TFSOI BiCMOS for Low Power RF Mixed-Mode Application". Babcock proposed a TFSOI BiCMOS device designed for low power RF mixed-mode application. Separation-by-implantation-of-oxygen (SIMOX) material with 0.1 micrometers silicon thickness and a 0.4 micrometer buried oxide are used for the process. The technology is based on a fully manufacturable TFSOI 0.5 micrometers LDD CMOS and lateral bipolar process which consists of poly-buffered-LOCOS isolation, 105 angstroms gate oxide, self-aligned silicided contacts, and 2-layer metallization.

However, the electrostatic shielding discharge (ESD) voltage of SOI CMOS output buffers is smaller than the ESD voltage of bulk NMOS buffers. Chan tried to realize the ESD voltage of SOI CMOS output buffers and bulk NMOS buffers, as reference to IEEE Trans. Electron Devices, vol. ED-42, page 1816, 1995. The title of the paper is "ESD Reliability and Protection Schemes in SOI CMOS Output Buffers". Chan pointed to the result that ESD voltage sustained by the bulk SOI CMOS buffers is only about half the voltage sustained by the bulk NMOS buffers. The authors tried to fabricate ESD protection circuit on the SOI substrate in order to enhance ESD reliability. The conclusion of the paper was that most of the method developed in bulk technology to improve ESD performance is not effective as well in SOI circuits. Chan proposed an alternative process of the through oxide ESD protection scheme. The cross sectional view of SOI MOS and bulk MOS was demonstrated in the FIG. 1 according to the paper as a finger structure to achieve a more uniform current density. The silicon film thickness and the buried oxide thickness of the devices as were mentioned above are 1630 and 1134 angstroms, respectively.

SUMMARY OF THE INVENTION

A method for manufacturing three dimension (3-D) CMOS transistors on a substrate is disclosed in the present invention. The substrate has pad oxide layers on the substrate and a thick field oxide is on the substrate between pad oxide layers. An oxygen ion implantation is achieved to form an oxygen amorphized region in the substrate below the pad oxide by using the field oxide as hard mask. The ion implantation is performed with high energy and high dosage.

Then, a high-temperature annealing is used to convert the oxygen amorphized region into an oxygen implant-induced oxide. The pad oxide layers and the field oxide are removed to form silicon islands on the oxygen implant-induced oxide. Afterwards, a thin gate oxide is grown on the surface of the silicon islands and the substrate to seal the silicon islands. Finally, PMOSFETs are formed on the silicon islands and the bulk NMOSFET buffers are formed on the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 shows the formation of localized Si islands on the oxygen implant-induced oxide regions;

FIG. 4 shows the removing of the field oxide and the pad oxide layer to form silicon islands on the oxygen implant-induced oxide region;

FIG. 5 shows a cross sectional view of the substrate with the sealed Si islands by regrowing a thin gate oxide; and FIG. 6 shows a cross sectional view of the substrate with SOI PMOSFETs on the silicon islands and bulk NMOSFET buffers on the substrate.

DETAILED DESCRIPTION OF THE PREFERRED EMBODIMENT

In the present invention, SOI PMOSFETs and bulk NMOSFET buffers are fabricated on a substrate. The SOI PMOSFETs are on silicon islands to isolate from the substrate and the bulk NMOSFET buffers are on the field oxide region after the field oxide is removed to increase the device's density. Using the bulk NMOSFET buffers, the electrostatic discharge (ESD) performance is improved.

Figure 1:
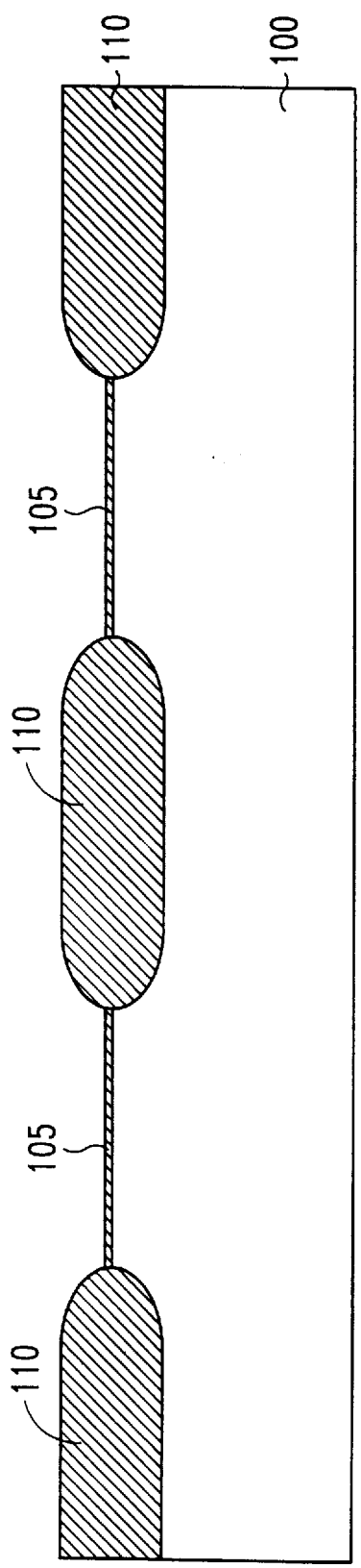
FIG. 1 shows a cross sectional view of a substrate with a field oxide region and a pad oxide layer on the substrate.

Referring to FIG. 1, a single crystal P-type substrate 100 with a <100> crystallographic orientation is used for the preferred embodiment. A pad oxide layer 105 is grown on the substrate 100 and it has a thickness between about 50 to 100 angstroms. In order to form the pad oxide layer 105 on the substrate 100, an oxygen ambient thermal processing is used with a thermal temperature above 800 centigrade. A silicon nitride pattern (not shown) is formed on the pad oxide layer 105 to define field oxide regions. After the definition of the field oxide region, a thick field oxide 110 is formed by using the thermal processing as is described above. The thickness of the field oxide 110 is between about 3000 to 10000 angstroms. The silicon nitride pattern is then removed using hot $H_3PO_4$ solution.

Figure 2:
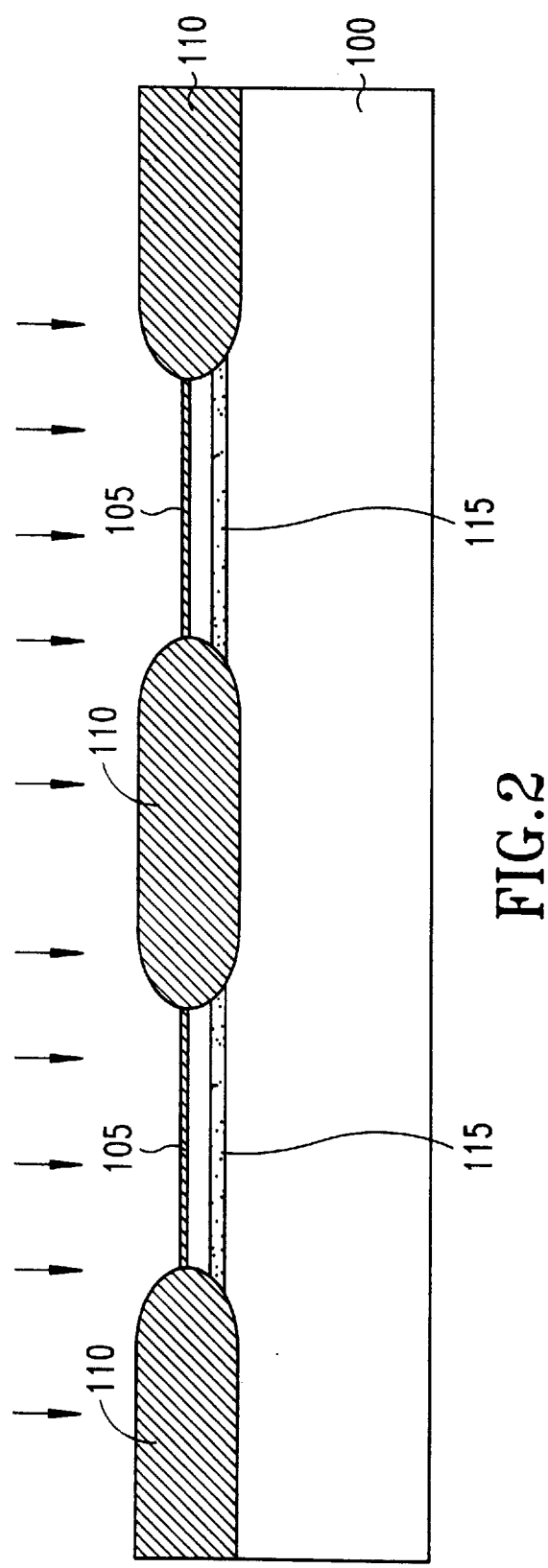
FIG. 2 shows the formation of oxygen amorphized region below the pad oxide layer.

Turning to FIG. 2, a high-energy and high-dose oxygen ion implantation is achieved to form an oxygen amorphized region 115 in the substrate 100 by using field oxide 110 as a hard mask. The energy of the implantation process is between about 100 to 500 KeV and the dose is between about $5\times10^{16}$ to $5\times10^{19}$ ions/cm$^2$. The substrate 100 is kept near 500 degrees centigrade during the implantation so that self-annealing maintains the crystal structure of the substrate 100. Formation of the oxygen amorphized region 115 causes the expansion of the buried layer and results to a slight swelling of the surface of the substrate 100. The implanting process related to VLSI Technology, edited by S. Sze, 1998, chapter 8, page 366 to 369.

Referring to FIG. 3, a high-temperature annealing is performed in a $N_2$ or $N_2/O_2$ ambient to convert the oxygen amorphized region 115 into an oxygen implant-induced oxide region 120. The annealing process is achieved at between about 1050 to 1350 degrees centigrade. After the high-temperature annealing, localized Si islands are formed on the oxygen implant-induced oxide region 120 to isolate from the substrate 100.

The implanted oxygen profile differs from that predicted by a simple linear theory because of sputtering, swelling and oxide formation. Some experiments are tested to realize the implanted profile saturated when the oxygen concentration reaches that of an oxide, and the additional oxygen ions of the oxygen amorphized region diffuse to the moving silicon-oxide boundaries. The profile of the buried oxide region is changed to a flat-topped distribution after the high-temperature annealing process is done.

After the implantation, the surface layer is still single crystal containing a substantial amount of oxygen and much damage. Annealing recovers much of the damage near the surface and causes only local diffusion of oxygen to the buried layer. As a result of the high-temperature annealing, a high-quality surface film containing little oxygen is formed with less than $10^9$ threading dislocations per square centimeter.

Turning to FIG. 4, a wet etching process with buffer oxide etching (BOE) solution or diluted HF solution as an oxide etcher is implemented to remove the pad oxide layer 105 and the field oxide region 110. The silicon islands 125 are formed and stand on the oxygen implant-induced oxide region 120. The thickness of the silicon islands 125 is related to the depth between the oxygen implant-induced oxide 120 and the surface of the substrate 100. That is, the energy and dosage of the implantation for forming the oxygen implant-induced oxide region 120 determined the thickness of the silicon islands 125.

Turning to FIG. 5, a thermal oxidation in an $N_2$ or NO ambient is performed to regrow a thin gate oxide layer 130 and the gate oxide layer 130 seals the silicon islands 125. In a case, the processing temperature of the thermal oxidation is between about 800 to 1000 centigrade.

As is illustrated in FIG. 6, PMOSFETs are fabricated on the gate oxide layer 130 on the silicon islands 125 and NMOSFETs are manufactured on the gate oxide layer 130 on the substrate 100. The gate structure 135 of the devices is defined onto the gate oxide layer 130 on the substrate 100 and the silicon islands 125. The source/drain regions of the PMOS and the NMOS devices are fabricated in the silicon islands 125 and the substrate 100, respectively. Then, a silicon oxide layer is deposited onto the substrate 100 and is etched back to form the spacers 145 of the gate structure 135.

There are several advantages in the present invention. The first advantage is that the device's density could be significant increase by using field oxide region for bulk NMOS transistors. The second advantage is that the ESD reliability could be improved by using bulk NMOS buffers as a protective circuit. The last advantage is that the recipe of the present invention is manufacturable.

While the preferred embodiment of the invention has been illustrated and described, it will be appreciated that various changes can be made therein without departing from the spirit and scope of the invention.

What is claimed is:

1. A method to manufacture 3-D CMOS transistors, the method comprising the steps of:

providing a substrate having a field oxide and pad oxide layers on said substrate, said field oxide defining a field oxide region between said pad oxide layers;

implementing an ion implantation having oxygen dopant to form an oxygen amorphized region in said substrate below said pad oxide layers, using said field oxide as a hard mask;

performing a thermal annealing to convert said oxygen amorphized region into an buried oxide region;

removing said pad oxide layers and said field oxide to form silicon islands on said buried oxide region;

forming a gate oxide layer on the surface of said silicon islands and said substrate; and forming P channel MOS devices in said silicon islands and N channel MOS devices in said substrate at said field oxide region.

2. The method of claim 1, wherein said field oxide has thickness between about 3000 to 10000 angstroms.

3. The method of claim 1, wherein said ion implantation for forming said oxygen amorphized region is performed with an energy between about 100 to 500 KeV and a dose between about $5\times10^{16}$ to $5\times10^{19}$ ions/cm$^2$.

4. The method of claim 1, wherein said thermal annealing is achieved in an $N_2$ ambient with a temperature between about 1050 to 1350 degrees centigrade.

5. The method of claim 1, wherein said thermal annealing is achieved in an $N_2$ and $O_2$ ambient with a temperature between about 1050 to 1350 degrees centigrade.

6. The method of claim 1, wherein said gate oxide layer and said field oxide are removed by using buffer oxide etching (BOE) solution.

7. The method of claim 1, wherein said gate oxide layer and said field oxide are removed by using diluted HF solution.

8. The method of claim 1, wherein said gate oxide layer is grown in an $N_2O$ ambient.

9. The method of claim 1, wherein said gate oxide layer is grown in an NO ambient.

10. A method for manufacturing silicon islands on a substrate, the method comprising the steps of:

providing a substrate;

forming a pad oxide on said substrate;

defining field oxide regions on said pad oxide;

forming field oxide on said substrate on the said field oxide region;

performing an ion implantation containing oxygen ions to form oxygen amorphized regions in said substrate below said pad oxide layers by using field oxide as a hard mask;

performing a thermal annealing to convert said oxygen amorphized region into an buried oxide region; and removing said pad oxide layers and said field oxide to form silicon islands on said buried oxide region.

11. The method of claim 10, wherein said field oxide has a thickness between about 3000 to 10000 angstroms.

12. The method of claim 10, wherein said ion implantation is implemented with an energy between 100 to 500 KeV and a dose between $5\times10^{16}$ to $5\times10^{19}$ ions/cm$^2$.

13. The method of claim 10, wherein said thermal annealing is performed in an $N_2$ ambient with a temperature 1050 to 1350 degrees centigrade.

14. The method of claim 10, wherein said thermal annealing is performed in an $N_2$ and $O_2$ ambient with a temperature 1050 to 1350 degrees centigrade.

15. The method of claim 10, wherein said pad oxide and said field oxide are removed by using buffer oxide etching (BOE) solution.

16. The method of claim 10, wherein said pad oxide and said field oxide are removed by using diluted HF solution.

* * * * *